US011558065B2

(12) United States Patent
Le et al.

(10) Patent No.: US 11,558,065 B2
(45) Date of Patent: Jan. 17, 2023

(54) RECONFIGURABLE ANALOG TO DIGITAL CONVERTER (ADC)

(71) Applicant: NXP B.V., Eindhoven (NL)

(72) Inventors: Jean Cauxuan Le, Santa Clara, CA (US); Carmelo Morello, San Jose, CA (US); See-Hoi Wong, Fremont, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/158,242

(22) Filed: Jan. 26, 2021

(65) Prior Publication Data
US 2022/0239313 A1 Jul. 28, 2022

(51) Int. Cl.
*H03M 1/00* (2006.01)
*H03M 3/00* (2006.01)

(52) U.S. Cl.
CPC ............ *H03M 3/458* (2013.01); *H03M 3/38* (2013.01)

(58) Field of Classification Search
CPC ........ H03M 1/12; H03M 1/1215; H03M 5/08; H03M 1/1225; H03M 1/46; H03M 13/27; H03M 13/2792; H03M 1/00
USPC ................. 341/141, 142, 155, 118, 120, 161
See application file for complete search history.

(56) References Cited

U.S. PATENT DOCUMENTS

| | | | | |
|---|---|---|---|---|
| 4,527,148 A * | 7/1985 | Kuboki | ................. | H03M 1/183 367/66 |
| 5,030,954 A * | 7/1991 | Ribner | .................... | H03M 3/47 341/172 |
| 6,486,809 B1 * | 11/2002 | Figoli | ................. | H03M 1/1225 341/155 |
| 6,697,006 B1 * | 2/2004 | McCartney | ........... | H03M 1/124 341/143 |
| 6,891,430 B1 * | 5/2005 | Thomsen | .............. | H03M 3/494 327/560 |
| 7,400,283 B1 * | 7/2008 | Zhu | ...................... | H03M 1/1225 341/122 |
| 7,446,573 B1 * | 11/2008 | Miller | ................. | H03M 1/0682 327/52 |
| 9,083,366 B1 * | 7/2015 | Annampedu | ......... | H04L 7/0331 |
| 9,270,291 B1 * | 2/2016 | Parnaby | ................. | H04B 17/21 |
| 9,793,910 B1 * | 10/2017 | Devarajan | ............. | H03M 1/124 |
| 2008/0180289 A1 * | 7/2008 | Su | .......................... | H03M 1/002 341/120 |
| 2012/0281784 A1 * | 11/2012 | Beydoun | ............. | H03M 1/1028 375/295 |
| 2014/0089536 A1 | 3/2014 | Pedersen et al. | | |
| 2018/0138919 A1 * | 5/2018 | Björk | .................. | H03M 1/1215 |
| 2020/0007148 A1 * | 1/2020 | Doorenbos | ............. | H03M 3/38 |
| 2020/0186159 A1 * | 6/2020 | Kokusho | ............... | H03M 1/121 |

FOREIGN PATENT DOCUMENTS

GB          2042838      *  9/1980    ............. H03K 13/02

\* cited by examiner

*Primary Examiner* — Linh V Nguyen

(57) ABSTRACT

One example discloses a reconfigurable analog to digital converter (ADC) device, including: an analog front end (AFE) configured to receive a set of analog input signals and generate a corresponding set of digital output signals; wherein the AFE includes a set of reconfigurable ADC conversion circuits; and a sequencer coupled to the AFE and configured to control the set of reconfigurable ADC conversion circuits with a first AFE channel configuration at a first time and a second AFE channel configuration at a second time.

22 Claims, 7 Drawing Sheets

RECONFIGURABLE ANALOG TO DIGITAL CONVERTER (ADC)

The present specification relates to systems, methods, apparatuses, devices, articles of manufacture and instructions for analog to digital conversion.

SUMMARY

According to an example embodiment, a reconfigurable analog to digital converter (ADC) device, comprising: an analog front end (AFE) configured to receive a set of analog input signals and generate a corresponding set of digital output signals; wherein the AFE includes a set of reconfigurable ADC conversion circuits; and a sequencer coupled to the AFE and configured to control the set of reconfigurable ADC conversion circuits with a first AFE channel configuration at a first time and a second AFE channel configuration at a second time.

In another example embodiment, the set of reconfigurable ADC conversion circuits include at least one ADC conversion timing circuit.

In another example embodiment, the ADC is a sigma-delta converter.

In another example embodiment, the sequencer 114 directly controls those reconfigurable ADC conversion circuits that control ADC conversion timing.

In another example embodiment, the sequencer is programmed with the second AFE channel configuration while the sequencer is currently controlling the AFE with the first AFE channel configuration.

In another example embodiment, the sequencer is programmed to execute multiple different sets of AFE channel configurations in a predetermined sequence.

In another example embodiment, the sequencer is programmed to execute multiple different sets of AFE channel configurations in a repeating cycle.

In another example embodiment, the sequencer transitions to a wait state after ADC conversions for the first AFE channel configuration and the second AFE channel configuration are completed; and after the wait state, the sequencer resumes ADC conversions in response to an external trigger signal received by the sequencer.

In another example embodiment, the sequencer is programmed to oversample the set of analog input signals with a third AFE channel configuration at a third time; and the third AFE channel configuration is same as the first AFE channel configuration.

In another example embodiment, the first and second AFE channel configurations specify a set of AFE timing signals.

In another example embodiment, the AFE timing signals include a time delay before start of an ADC conversion.

In another example embodiment, the AFE timing signals include an ADC conversion data rate.

In another example embodiment, the AFE timing signals include a chopping rate between at least two different ADC channel conversions.

In another example embodiment, the first and second channel AFE configurations specify a set of ADC channel gains.

In another example embodiment, the first and second channel AFE configurations specify a set of ADC channel filters.

In another example embodiment, the first and second channel AFE configurations specify a channel specific set of digital signal under-range thresholds.

In another example embodiment, the first and second channel AFE configurations specify a channel specific set of digital signal over-range thresholds.

In another example embodiment, the first and second channel AFE configurations specify a set of ADC channel gain calibration coefficients.

In another example embodiment, the first and second channel AFE configurations specify a set of ADC offset calibration coefficients.

In another example embodiment, the first and second channel AFE configurations specify a set of high or low voltage analog inputs.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
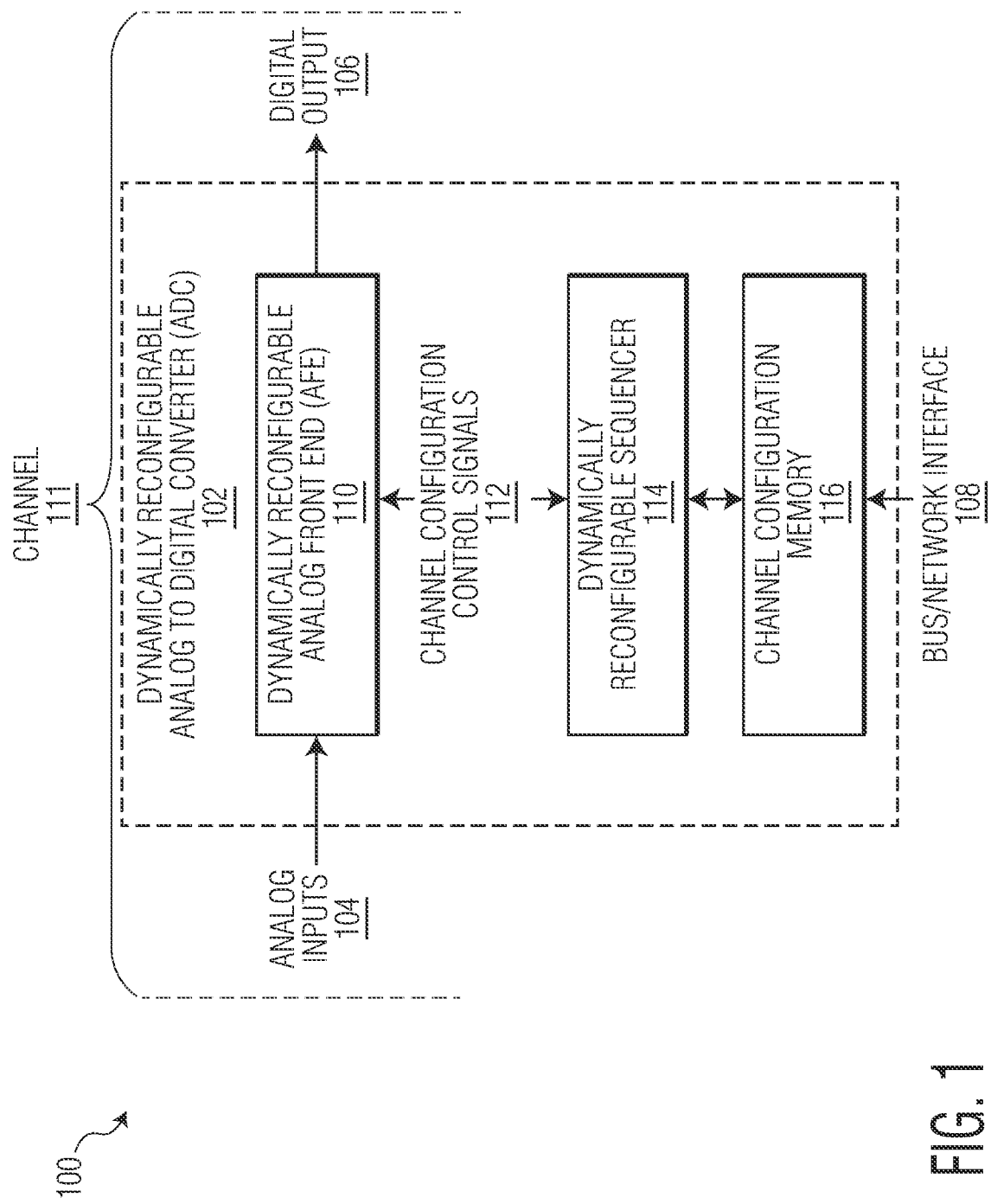
FIG. 1 represents an example analog to digital converter (ADC) system.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Analog to digital converters (ADC) provide an essential function within many modern electronic devices and are growing in importance as computing move closer to the "edge". However "edge" devices as an example have a number of preferred constraints. They should be power efficient, they should be fast and accurate, they should be more autonomous and they should be compact. Current ADC designs leave room for improvement.

Now discussed is a dynamically reconfigurable analog to digital converters (ADC) architecture and some example embodiments for applications/implementations. The dynamically reconfigurable ADC can be applied to an on-chip 24-bit Sigma Delta ADC converter so as to convert a wide range of multi-input analogue signals, for example. The dynamically reconfigurable ADC can also be applied to a programmable logic control (PLC) circuits, I/O modules, and/or data loggers.

The ADC can be dynamically reconfigured, depending upon the example embodiment, 16 or more different types of analogue inputs for digital conversion.

The dynamically reconfigurable ADC discussed below includes, manual, semi-autonomous, and autonomous modes that reduce computational loading on an external host processor or even can be operated with or without any microcontroller unit (MCU) or central processing unit (CPU), have improved data conversion rates since external bus transactions are not required, and reduce power consumption that otherwise would be needed by such external components. The ADC's autonomous operation enables very accurate and precision timing to control the various analog front end (AFE) circuits to achieve high performance and high precision conversion result.

FIG. 1 represents an example analog to digital converter (ADC) system 100. The example system 100 includes a dynamically reconfigurable ADC 102 configured to receive a wide variety of analog inputs 104 and generate digital outputs 106.

The dynamically reconfigurable ADC 102 is configured to receive configuration commands and export the digital outputs 106 over a bus/network interface 108. The bus/network interface 108 in some example embodiments includes a command decoder (not shown), an internal trigger signal input (not shown), an external trigger signal input (not shown), and a serial bus interface (I/F) (not shown).

The ADC 102 includes a dynamically reconfigurable analog front end (AFE) 110 that can be commanded into various channel 111 configurations. Channel 111 is herein defined as the AFE's 110 processing of a specific set of the analog inputs 104 into a specific set of the digital outputs 106).

The AFE 110 is responsive to a set of channel configuration control signals 112 output by a dynamically reconfigurable sequencer 114 within the ADC 102. The dynamically reconfigurable sequencer 114 includes a channel configuration memory/registers 116 that has been pre-programmed or programmed in real-time by an external host device (e.g. separate microcontroller, CPU, etc.) over the bus/network interface 108. The sequencer 114 has direct control over the whole analogue signal chain from the AFE 110 to subsequent digital filters and ADC data post processing units.

The sequencer 114 in some example embodiments includes at least three modes of operation: manual, semi-autonomous, and fully autonomous. In any of the three modes, the sequencer 114 is pre-configured or configured in real-time with one or more specific channel configurations (i.e. analog to digital conversions). These three modes of operation can be triggered by either external event (signal) received over the bus/network interface 108, or based on its internal pre-loaded system configuration (see FIGS. 3, 4, 5A and 5B).

In the Manual Mode, one of the configurations in the sequencer's 114 memory/registers 116 is selected and the corresponding ADC conversion is triggered by external or internal event. Once the ADC conversion completes the sequencer 114 stops and goes to a waiting state until a next trigger event is received. The manual mode can be used in single channel ADC conversion with either host or external driven triggered conversion.

In the Semi-autonomous Mode, several configurations in the sequencer's 114 memory/registers 116 are selected and several ADC conversions are triggered by either an external or internal event. All selected configuration for conversions complete the sequencer 114 stops and goes to a waiting state until a next trigger event is received.

In the Fully Autonomous Mode, several configurations in the sequencer's 114 memory/registers 116 are selected and several ADC conversions are triggered by either an external or internal event. All selected configuration for conversions even after being completed continue to run again until either external or internal trigger event is received that stops the conversions and/or restarts/resets the conversions.

Figure 2:
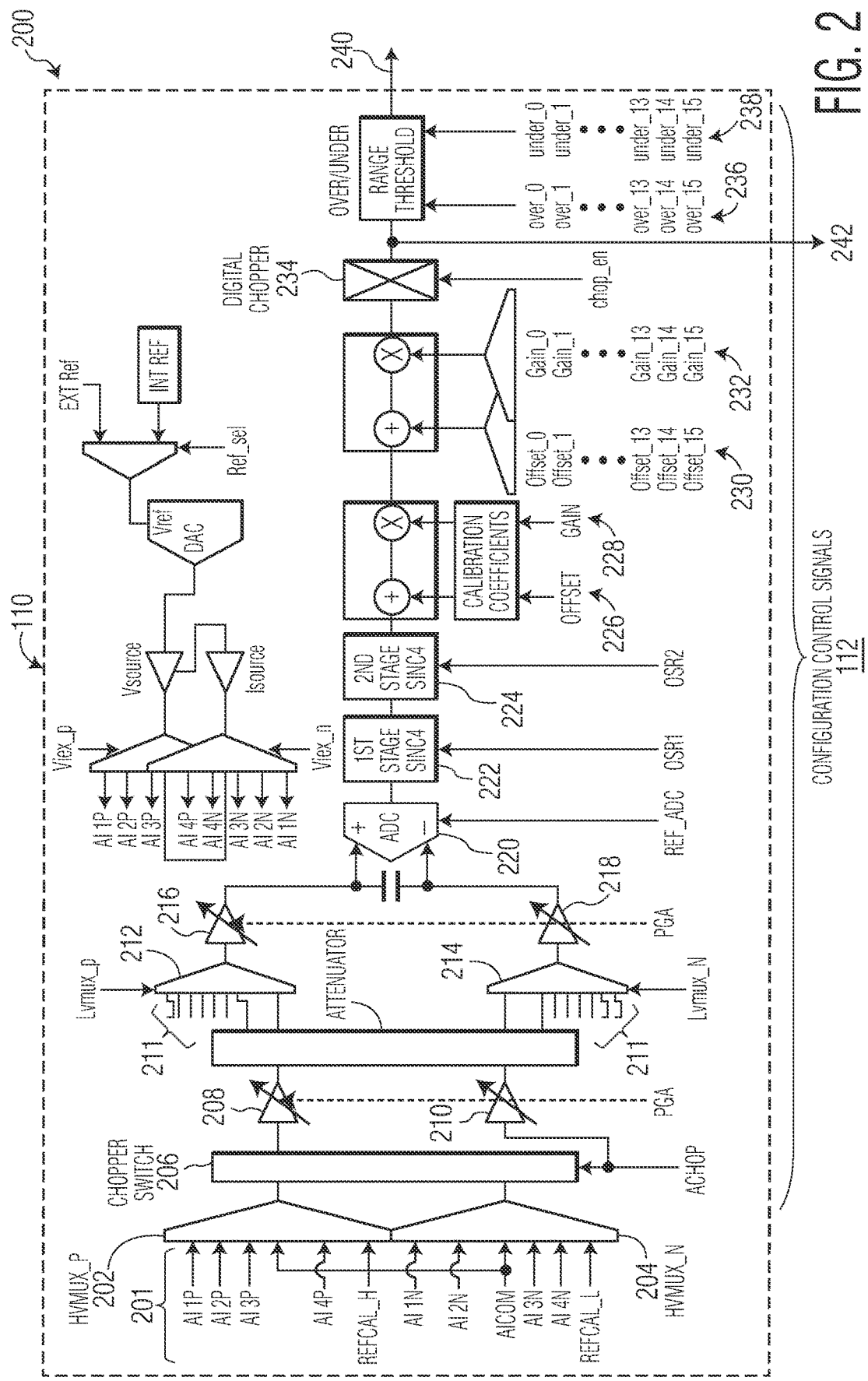
FIG. 2 represents an example dynamically reconfigurable analog front end (AFE) within the system.

FIG. 2 represents an example dynamically reconfigurable analog front end (AFE) 110 within the system 100.

The example 200 AFE 110 includes: a set of high-voltage (HV) analog signal inputs 201, a first selectable HV MUX 202, a second selectable HV MUX 204, a HV analog chopper switch 206, HV programmable channel gain amplifiers 208, 210, low-voltage (LV) analog signal inputs 211, a first selectable LV MUX 212, a second selectable LV MUX 214, a LV analog chopper switch (not shown), LV programmable channel gain amplifiers 216, 218, and a programmable ADC element 220 (e.g. with a reconfigurable time delay before start of an ADC conversion, and a reconfigurable ADC conversion data rate).

The example 200 AFE 110 further includes: a set of channel filters 222, 224, a factory initialized offset calibration coefficient 226, a factory initialized channel gain calibration coefficient 228, a programmable set of channel specific offset calibration coefficients 230, a programmable set of channel specific gain calibration coefficients 232, a digital chopper switch 234 synchronized to previously mentioned analog chopper switch 206, a programmable set of channel specific digital signal over-range threshold 236, a programmable set of channel specific digital signal under-range thresholds 238, a set of status/interrupt flag outputs 240, and a set of AFE digital signal outputs 242 that are either directly or after post-digital processing presented on the digital outputs 106.

Example, AFE 110 channel configuration variable corresponding to one or more of the dynamically reconfigurable AFE 110 elements include: a Channel enable, High/Low voltage signal input select, Channel gain, ADC filter options, Time delay before start of ADC conversion, ADC conversion data rate, Channel-level chopping for multiple in parallel ADC channel conversions, ADC under-range thresholds, ADC over-range thresholds, Gain calibration coefficient select, and Offset calibration coefficient select.

In some example embodiments, the AFE 110 can include low-leakage high-voltage multiplexers, low offset drift buffers, low noise and drift PGAs, a precision 24-bit sigma Delta ADC, and/or low-drift voltage references.

Figure 3:
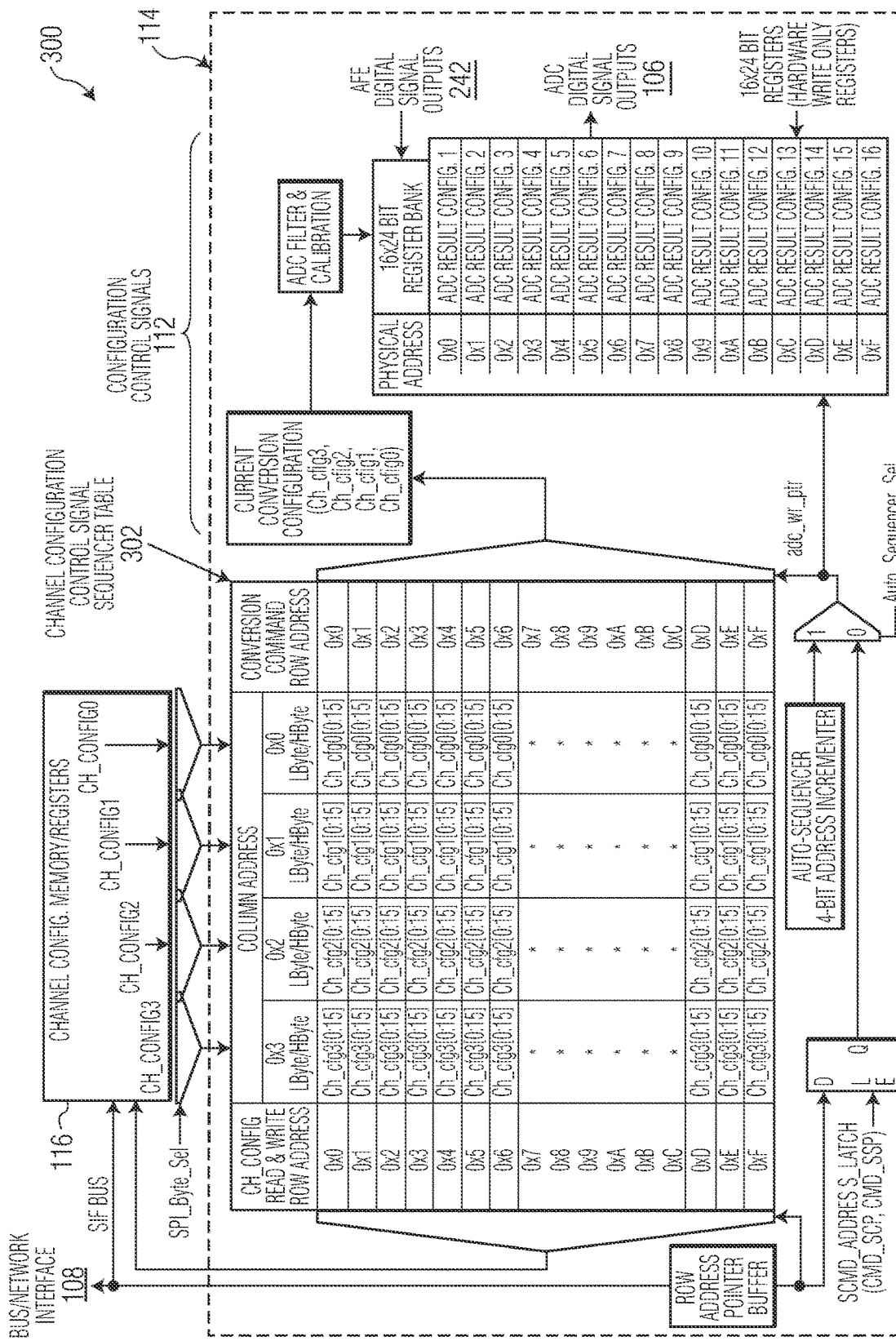
FIG. 3 represents an example dynamically reconfigurable sequencer within the system.

FIG. 3 represents an example dynamically reconfigurable sequencer 114 within the system 100. The example 300 reconfigurable sequencer 114 is coupled to: receive and transmit data through the bus/network interface 108, output the channel configuration control signals 112, be pre-configured by AFE 110 configuration settings stored in the channel configuration memory/registers 116, receive the AFE digital signal outputs 242, and output the ADC digital signal outputs 106.

The reconfigurable sequencer 114 includes a channel configuration control signal sequencer table 302 that is loaded by the AFE 110 configuration settings stored in the channel configuration memory/registers 116.

The sequencer 114 allows the external MCU/CPU host computer to dynamically reconfigure any of the channel configuration memory/registers 116 while the sequencer 114 is in operation (e.g. CH_CONFIG0-CH_CONFIG3).

While data is storing in the channel configuration memory/registers 116, the sequencer 114 can also be operating and comparing the configuration data to the pre-set thresholding under/over table values getting selected by the channel base configuration of the thresholding pointer in the channel configuration control signal sequencer table 302. Each of the row in the sequencer table 302 can be programmed with different configurations named channel configuration.

With the channel-based configurations, the on-chip sequencer 114 may switch among the configured channels without a need to perform multiple bus transactions with an external computer or microcontroller to setup various configuration before each ADC conversion. The channel configuration control signal sequencer table 302 has direct logical links to the four channel configuration memory/registers 116.

In the example 300 embodiments shown, there are sixteen AFE 110 channel configurations that are programmable into the sequencer's 114 channel configuration memory 116 and each one of them provides a set of register bits used to configure a single logic channel. Each of the row addresses in the sequencer memory table stores 64 bits that are combined with 4×16 bits in the four channel configuration registers: CH_CONFIG0, CH_CONFIG1, CH_CONFIG2, and CH_CONFIG3. There are sixteen physical locations, row addresses in the sequencer memory table that holds the sixteen different AFE channel configurations. Each AFE channel configuration is programmed-by host through the four channel configuration registers. In some system applications, some rows can be programmed the same configuration for oversampling purpose.

In the autonomous mode, the sequencer steps through from CH0 to CH15 (or Current channel to CH15) to execute the enabled channels (MCH_EN[15:0]) and store ADC output in the corresponding ADC DATA output registers. In the autonomous mode the sequencer 114 is configured to run as indefinite loop until it is instructed to stop. ADC data is stored in the 16×24 circular FIFO buffer.

In non-autonomous mode, the external MCU/CPU host computer can select the desired channel configuration to execute by setting channel row pointer and activated by the correspondent pointer command, then send a single conversion command. ADC data is stored at the ADC write pointer where the command pointer was activated.

The external MCU/CPU host can read the AFE digital signal outputs 242 whenever the digital output data is ready via the bus/network interface 108. There are two independent rows of configuration read out. One is shown from the left for host can have read/write access anytime if it needs to modify and verify during reconfiguration of any desire of configuration row change. The other is shown from the right has only read access during sequencer stepping through the configuration conversion sequence.

In some example embodiments because of the dynamic low to high analog input voltage selection and/or vice versa switching nature, any anomaly such as shortage, over voltage/current the sequencer will set one or more of the status/interrupt flag outputs 240 and alert the sequencer 114 to abort or end a current sequence of ADC conversions.

Figure 4:
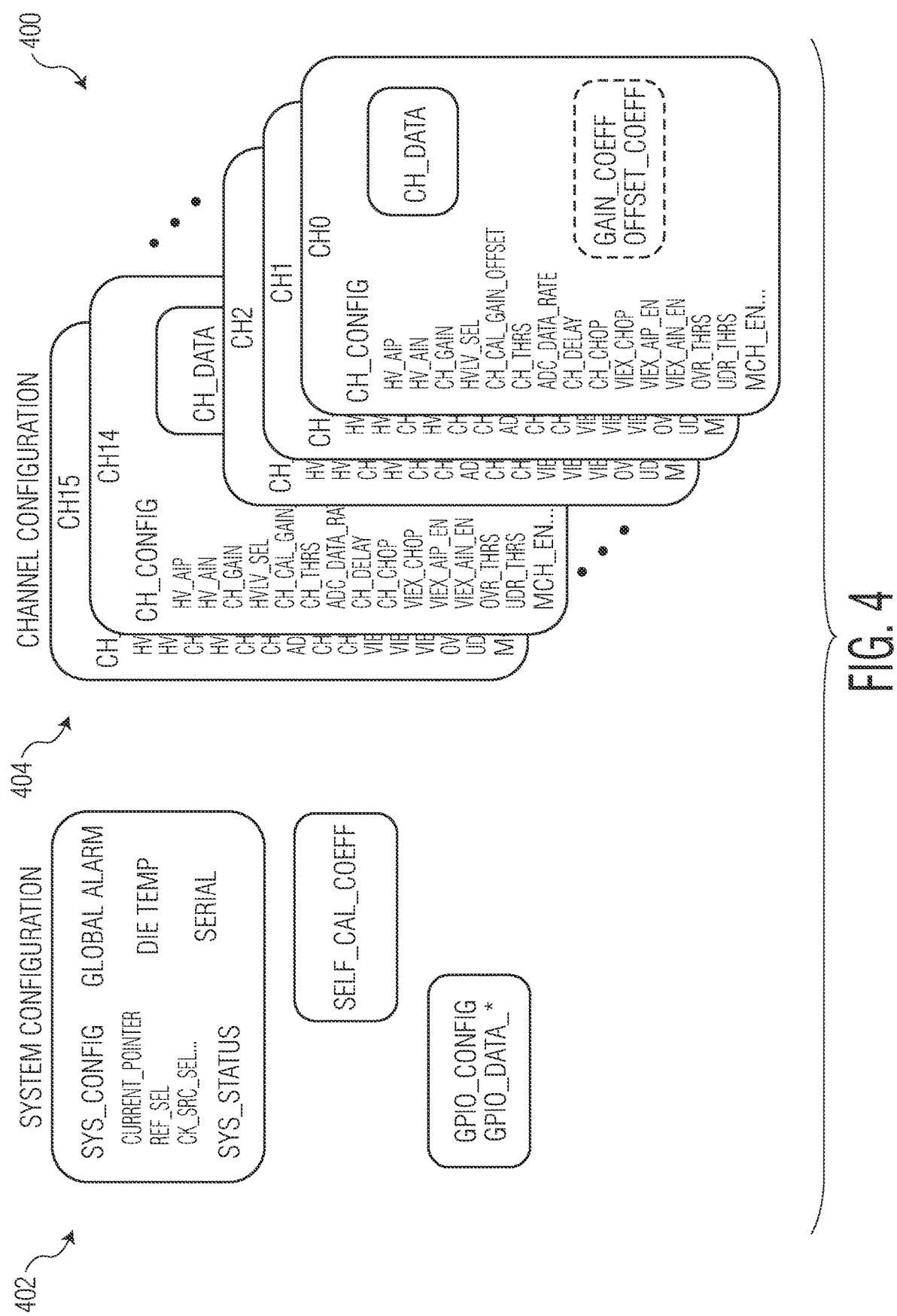
FIG. 4 represents an example set of ADC system configurations and channel configurations for the system.

FIG. 4 represents an example 400 set of reconfigurable ADC system configurations 402 and reconfigurable channel configurations 404 for the system 100. The channel configurations 404 are stored in the channel configuration control signal sequencer table 302.

Figure 5A:
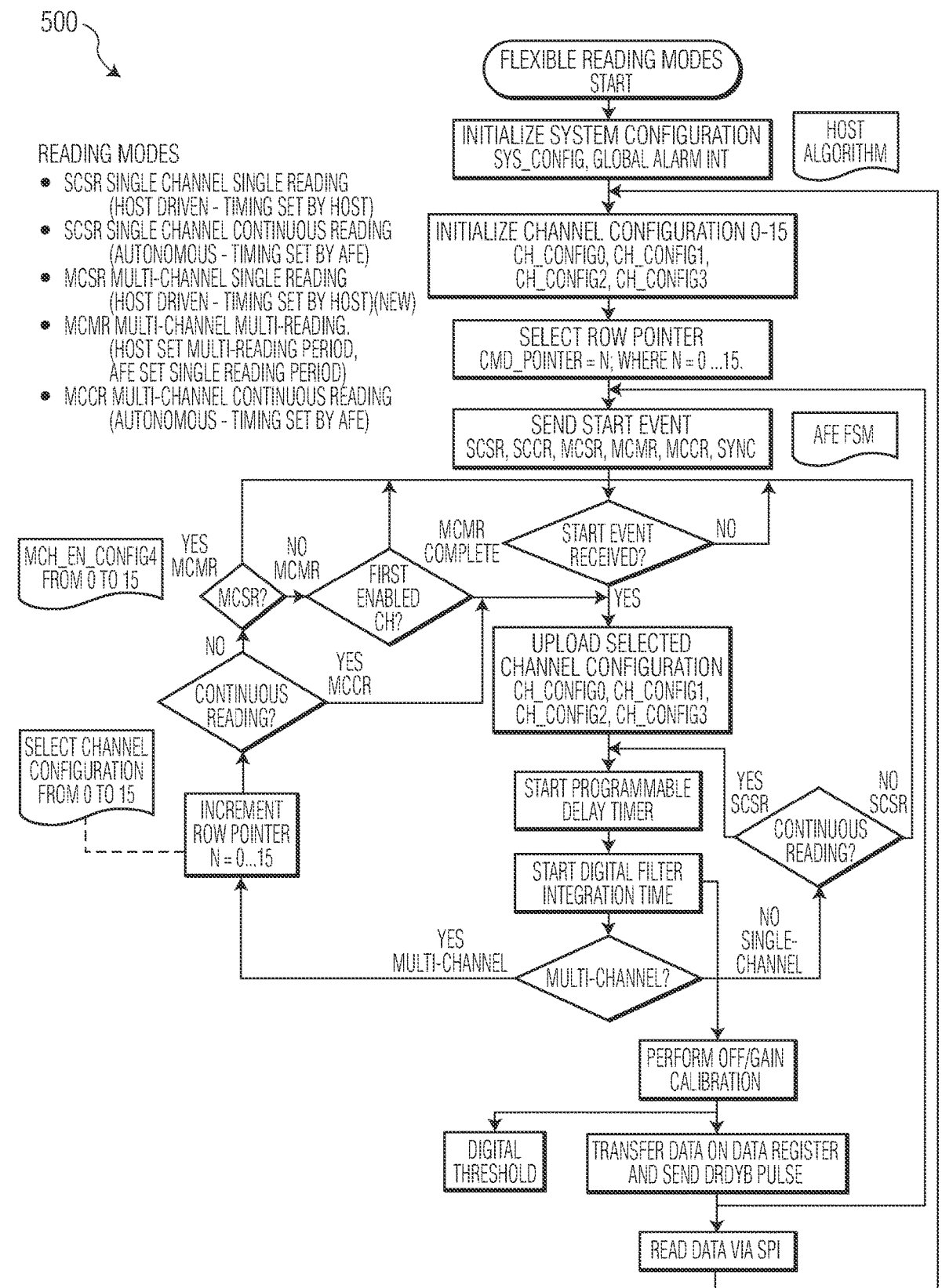
FIG. 5A represents an example set of instructions for enabling the system.

FIG. 5A represents an example 500 set of instructions for enabling the system 100. The order in which the instructions are shown does not limit the order in which other example embodiments implement the instructions unless otherwise specifically stated. Additionally, in some embodiments the instructions are implemented concurrently.

The example 500 shows steps for initializing the system 100 and programming various channel configurations into the channel configuration control signal sequencer table 302 and which the sequencer 114 then executes. Handshaking between the ADC 102 and an external host computer or microcontroller is also shown after an ADC conversion is ready for the external host to retrieve the digital output 106 data.

Figure 5B:
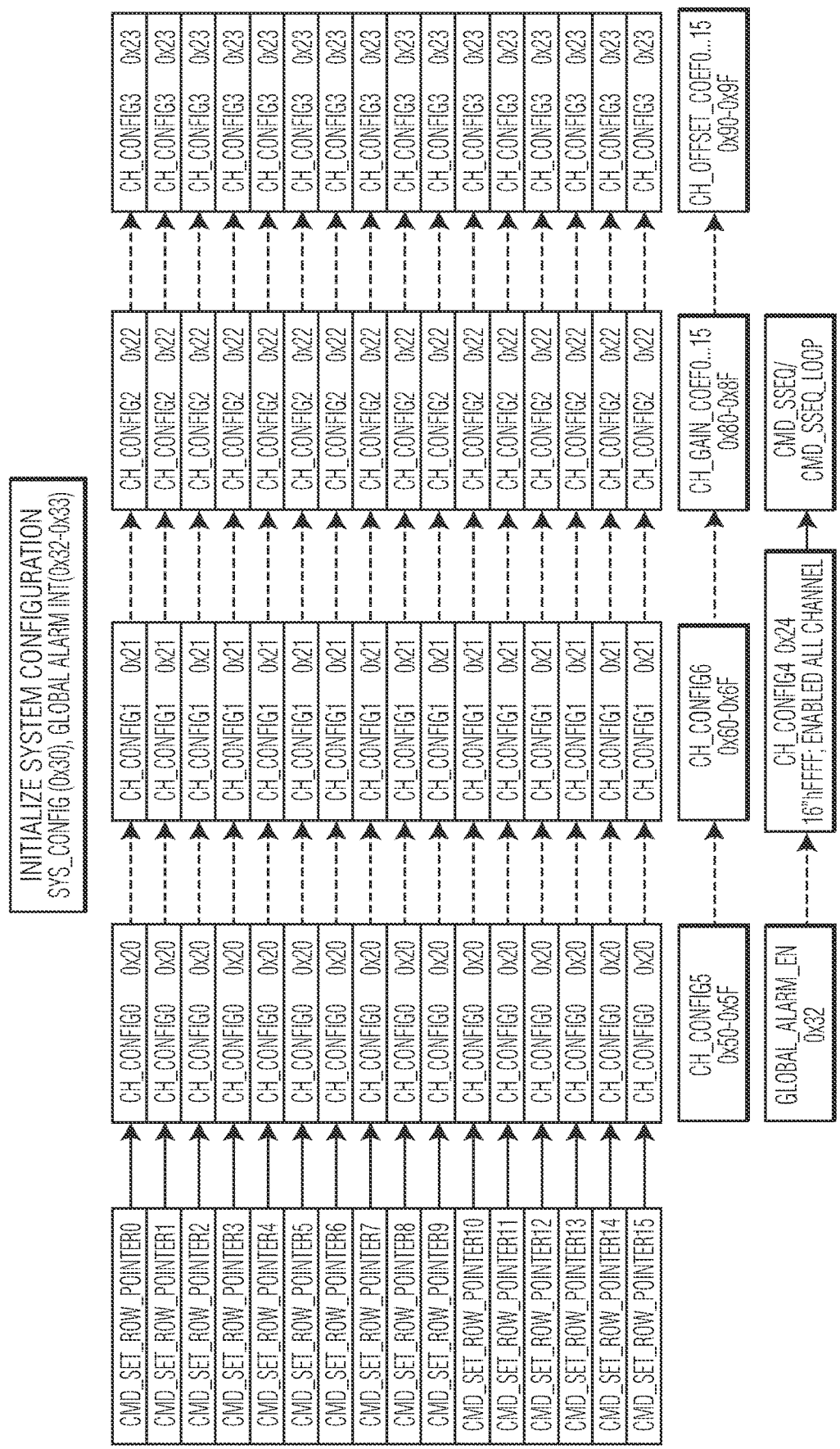
FIG. 5B represents an example set of ADC system channel configurations programmed into a channel configuration control signal sequencer table for execution by the example set of instructions.

FIG. 5B represents an example 502 set of ADC system 100 channel configurations programmed into the channel configuration control signal sequencer table 302 for execution by the example 500 set of instructions.

In this example 502 each row of the table 302 is programmed from a low row to a high row. Other programming orders are possible. When all configurations are programmed, the command SSEQ is sent, and either one loop of all the active channels is executed before automatically stopping, or a command SSEQ_LOOP is sent, and an indefinite loop through all the active channels is executed until an external stop command is received.

Figure 6:
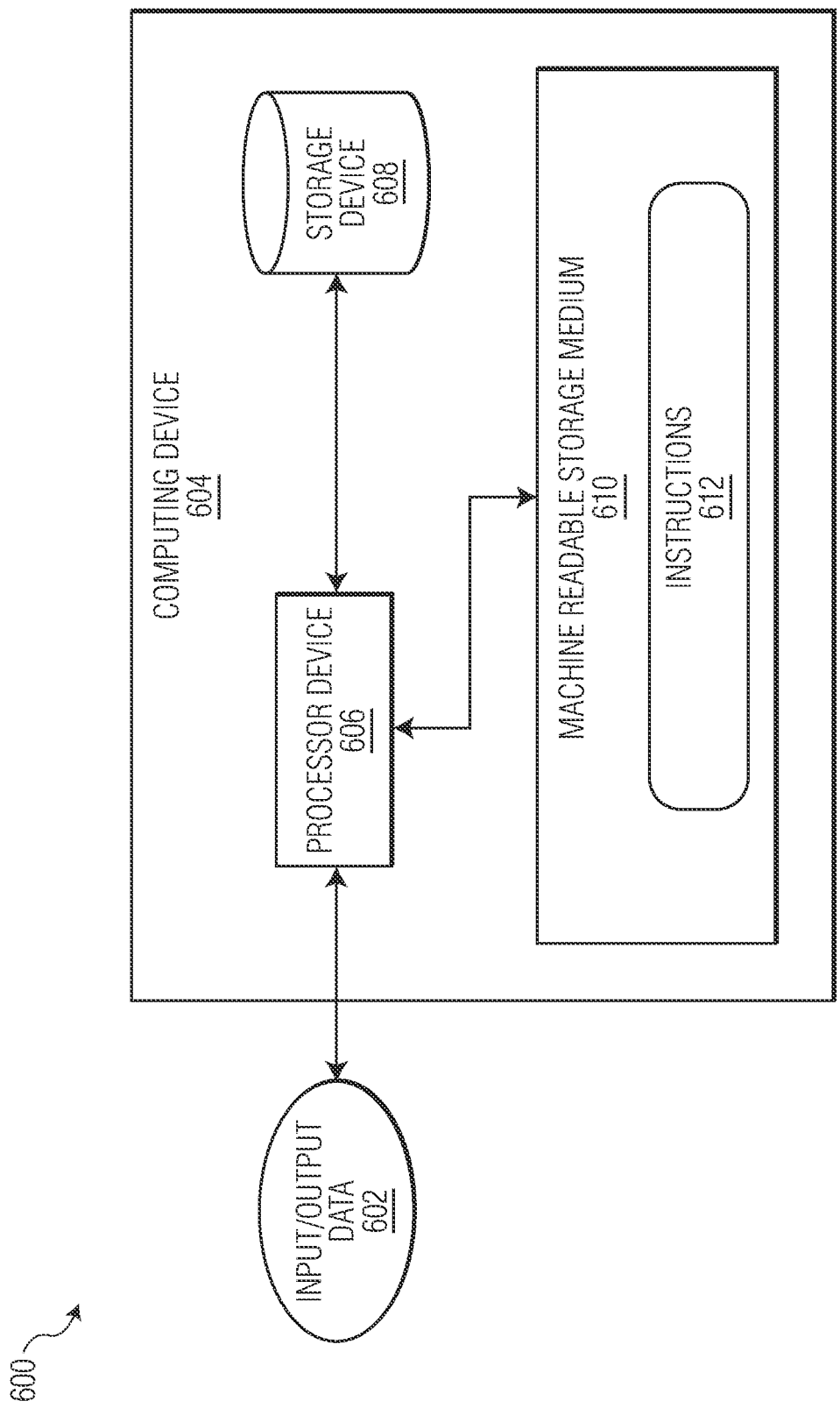
FIG. 6 represents an example computer or microcontroller for hosting the instructions for enabling the system.

FIG. 6 represents an example 600 computer or microcontroller for hosting the example 500 instructions for enabling the system. The example 600 shows an input/output data 602 interface with a computing device 604. The computing device 604 includes a processor device 606, a storage device 608, and a machine-readable storage medium 610. Instructions 612 within the machine-readable storage medium 610 control how the processor 606 interprets and transforms the input data 602, using data within the storage device 608. The machine-readable storage medium in an alternate example embodiment is a computer-readable storage medium.

The processor (such as a central processing unit, CPU, microprocessor, application-specific integrated circuit (ASIC), etc.) controls the overall operation of the storage device (such as random access memory (RAM) for temporary data storage, read only memory (ROM) for permanent data storage, firmware, flash memory, external and internal hard-disk drives, and the like). The processor device communicates with the storage device and non-transitory machine-readable storage medium using a bus and performs operations and tasks that implement one or more instructions stored in the machine-readable storage medium. The machine-readable storage medium in an alternate example embodiment is a computer-readable storage medium.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

The term file or a set of files refers to any collection of files, such as a directory of files. A file can refer to any data object (e.g., a document, a bitmap, an image, an audio clip, a video clip, software source code, software executable code, etc.). A file can also refer to a directory (a structure that contains other files).

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A reconfigurable analog to digital converter (ADC) device, comprising:
    an analog front end (AFE) configured to receive a set of analog input signals and convert into a corresponding set of digital output signals;
    wherein the AFE includes a set of reconfigurable ADC conversion circuits; and
    a sequencer coupled to the AFE and configured to control the set of reconfigurable ADC conversion circuits with a first AFE channel configuration at a first time and a second AFE channel configuration at a second time.

2. The device of claim 1:
    wherein the set of reconfigurable ADC conversion circuits include at least one ADC conversion timing circuit reconfigured by at least one of the AFE channel configurations.

3. The device of claim 1:
    wherein the ADC is a sigma-delta converter reconfigured by at least one of the AFE channel configurations.

4. The device of claim 1:
    wherein the sequencer directly controls a set of reconfigurable ADC conversion circuits that control ADC conversion timing.

5. The device of claim 1:
    wherein the sequencer is programmed with the second AFE channel configuration while the sequencer is currently controlling the AFE with the first AFE channel configuration.

6. The device of claim 1:
    wherein the sequencer is programmed to execute multiple different sets of AFE channel configurations in a predetermined sequence.

7. The device of claim 1:
    wherein the sequencer is programmed to execute multiple different sets of AFE channel configurations in an automatically repeating cycle.

8. The device of claim 1:
    wherein the sequencer transitions to a wait state after ADC conversions for the first AFE channel configuration and the second AFE channel configuration are completed; and
    wherein after the wait state, the sequencer resumes ADC conversions in response to an external trigger signal received by the sequencer.

9. The device of claim 1:
    wherein the sequencer is programmed to oversample the set of analog input signals with a third AFE channel configuration at a third time; and
    wherein the third AFE channel configuration is same as the first AFE channel configuration.

10. The device of claim 1:
    wherein the first and second AFE channel configurations specify a set of AFE timing signals reconfigured by at least one of the AFE channel configurations.

11. The device of claim 10:
    wherein the AFE timing signals include a time delay before start of an ADC conversion.

12. The device of claim 10:
    wherein the AFE timing signals include an ADC conversion data rate.

13. The device of claim 10:
    wherein the AFE timing signals include a chopping rate between at least two different ADC channel conversions.

14. The device of claim 1:
    wherein the first and second channel AFE configurations specify a set of ADC channel gains reconfigured by at least one of the AFE channel configurations.

15. The device of claim 1:
    wherein the first and second channel AFE configurations specify a set of ADC channel filters reconfigured by at least one of the AFE channel configurations.

16. The device of claim 1:
    wherein the first and second channel AFE configurations specify a channel specific set of digital signal under-range thresholds reconfigured by at least one of the AFE channel configurations.

17. The device of claim 1:
    wherein the first and second channel AFE configurations specify a channel specific set of digital signal over-range thresholds reconfigured by at least one of the AFE channel configurations.

18. The device of claim 1:
wherein the first and second channel AFE configurations specify a set of ADC channel gain calibration coefficients reconfigured by at least one of the AFE channel configurations.

19. The device of claim 1:
wherein the first and second channel AFE configurations specify a set of ADC offset calibration coefficients reconfigured by at least one of the AFE channel configurations.

20. The device of claim 1:
wherein the first and second channel AFE configurations specify a set of high or low voltage analog inputs reconfigured by at least one of the AFE channel configurations.

21. The device of claim 1:
wherein the AFE channel configurations are retrieved from a lookup table.

22. A reconfigurable analog to digital converter (ADC) device, comprising:
an analog front end (AFE) configured to receive a set of analog input signals, a set of channel configuration control signals, and convert into a corresponding set of digital output signals;
wherein the AFE includes a set of reconfigurable ADC conversion circuits;
a sequencer coupled to the AFE and including a channel configuration control signal sequencer table;
wherein the sequencer is configured to control the set of reconfigurable ADC conversion circuits with a first set of channel configuration control signals retrieved from the channel configuration control signal sequencer table at a first time and a second set of channel configuration control signals retrieved from the channel configuration control signal sequencer table at a second time.

* * * * *